(12) United States Patent
Ogo et al.

(10) Patent No.: US 9,664,335 B2
(45) Date of Patent: May 30, 2017

(54) ARTICLE SUPPORT DEVICE AND METHOD FOR PLACING TWO TYPES OF ARTICLES ON SUPPORT DEVICE

(71) Applicant: Murata Machinery, Ltd., Kyoto-shi, Kyoto (JP)

(72) Inventors: Haruki Ogo, Inuyama (JP); Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/021,388

(22) PCT Filed: Jul. 17, 2014

(86) PCT No.: PCT/JP2014/069019
§ 371 (c)(1),
(2) Date: Mar. 11, 2016

(87) PCT Pub. No.: WO2015/045583
PCT Pub. Date: Apr. 2, 2015

(65) Prior Publication Data
US 2016/0223136 A1     Aug. 4, 2016

(30) Foreign Application Priority Data

Sep. 27, 2013   (JP) ................................. 2013-201778

(51) Int. Cl.
*F16M 13/02*     (2006.01)
*H01L 21/68*     (2006.01)
(Continued)

(52) U.S. Cl.
CPC ....... *F16M 13/02* (2013.01); *H01L 21/67379* (2013.01); *H01L 21/67769* (2013.01);
(Continued)

(58) Field of Classification Search
CPC ... F16M 13/02; H01L 21/67769; H01L 21/68; H01L 21/67379; H01L 21/6775; H01L 21/6875; H01L 21/68771
USPC ............... 248/310, 314, 223.41, 678, 346.01
See application file for complete search history.

(56) References Cited

U.S. PATENT DOCUMENTS 4,977,836 A * 12/1990  Bond ..................... B65D 19/44
                                                            108/55.1
6,432,849 B1    8/2002  Endo et al.
(Continued)

FOREIGN PATENT DOCUMENTS

CN       202268335 U     6/2012
JP       11-163085 A     6/1999
(Continued)

OTHER PUBLICATIONS

English language translation of International Preliminary Report on Patentability dated Mar. 31, 2016 issued on corresponding International application No. PCT/JP2014/069019.
(Continued)

*Primary Examiner* — Tan Le
(74) *Attorney, Agent, or Firm* — DLA Piper LLP (US)

(57) ABSTRACT

A support device on which two types of articles that differ in size are positioned and placed is provided. A first article and a second article having a larger bottom portion than that of the first article are to be placed on a placing surface of a support device. A first positioning member protruding from the placing surface for positioning the bottom portion of the first article and a second positioning member protruding from the placing surface for positioning the second article are provided. The first positioning member is arranged at a position where interference with the second article is prevented when the second article is positioned on the placing surface by the second positioning member, and the second (Continued)

positioning member is arranged at a position where interference with the first article is prevented when the first article is positioned on the placing surface by the first positioning member.

5 Claims, 3 Drawing Sheets

(51) Int. Cl.
B65G 1/14 (2006.01)
H01L 21/673 (2006.01)
H01L 21/677 (2006.01)
H01L 21/687 (2006.01)

(52) U.S. Cl.
CPC ........ *H01L 21/67775* (2013.01); *H01L 21/68* (2013.01); *H01L 21/6875* (2013.01); *H01L 21/68771* (2013.01)

(56) References Cited

U.S. PATENT DOCUMENTS

| 2003/0089313 | A1 | 5/2003 | Ham et al. ................... 118/500 |
| 2007/0284217 | A1 | 12/2007 | Ito ................................ 198/346 |
| 2008/0063496 | A1* | 3/2008 | Bufano ............. H01L 21/67017 414/331.01 |
| 2010/0065466 | A1* | 3/2010 | Perkins ................ B65D 19/385 206/600 |
| 2011/0214778 | A1* | 9/2011 | Natsume ........... H01L 21/67775 141/4 |

FOREIGN PATENT DOCUMENTS

| JP | 2002-002909 A | 1/2002 |
| JP | 2003-174068 A | 6/2003 |
| JP | 2003-282672 A | 10/2003 |
| JP | 2005-197431 A | 7/2005 |
| JP | 2007-287877 A | 11/2007 |

OTHER PUBLICATIONS

Japanese language International Search Report dated Oct. 21, 2014 and its English language translation issued in corresponding PCT application PCT/JP2014/069019 cites the foreign patent documents listed above.

Extended European Search Report dated Mar. 22, 2017 issued in corresponding European Patent Application No. EP 14847792.0 (EP 14 84 7792) cites the document above.

* cited by examiner

ARTICLE SUPPORT DEVICE AND METHOD FOR PLACING TWO TYPES OF ARTICLES ON SUPPORT DEVICE

CROSS REFERENCE TO RELATED APPLICATIONS

This application is a national stage of international application no. PCT/JP2014/069019, filed on Jul. 17, 2014, and claims the benefit of priority under 35 USC 119 of Japanese application no. 2013-201778, filed on Sep. 27, 2013, which are incorporated herein by reference.

BACKGROUND OF THE INVENTION

1. Field of the Invention

The present invention relates to positioning and placing two types of articles that differ in size on a common support device.

2. Description of the Related Art

It is convenient if common support devices are usable for two types of articles that differ in size. For example, in a factory that deals with two types of semiconductor wafers that differ in size, two types of containers are used for the respective wafers, and therefore, it is convenient if these containers can be supported on the same support devices. These containers are provided with "V"-shaped grooves in a cross section at three positions in a bottom portion of the containers, and the containers are normally positioned by coupling three pins provided in the support device with the grooves. When these grooves are used to position the containers, only one type of the articles can be positioned. Therefore, two types of support devices are needed depending on the types of containers, resulting in inefficiency.

A related prior art will be shown. Patent Literature 1 (JP 2007-287877A) proposes a transport system for transporting two types of large and small articles where a container for the small article is accommodated in a container for the large article and they are transported.

CITATION LIST

Patent Literature

Patent Literature 1: JP 2007-287877A

SUMMARY OF THE INVENTION

The object of the present invention is to provide a support device and a placing method for positioning and placing two types of articles that differ in size.

On an article support device according to the present invention a plurality of types of articles are placed, the device comprising:

a placing surface configured to support both a first article and a second article having a larger bottom portion than a bottom portion of said first article thereon;

a first positioning member protruding from said placing surface for positioning the bottom portion of said first article; and a second positioning member protruding from said placing surface for positioning said second article, wherein said first positioning member is arranged at a position where interference with said second article is prevented when said second article is positioned on the placing surface by said second positioning member, and wherein said second positioning member is arranged at a position where interference with said first article is prevented when said first article is positioned on the placing surface by said first positioning member.

A method for placing two types of articles on a support device according to the present invention is a method for placing a plurality of types of articles on the support device, the support device comprising: a placing surface configured to support both a first article and a second article having a larger bottom portion than a bottom portion of said first article thereon; a first positioning member; and a second positioning member, both protruding from said placing surface, the method comprising:

a step for positioning the first article by the first positioning member and placing the first article on the placing surface while interference between the second positioning member and the first article is avoided, and a step for positioning the second article by the second positioning member and placing the second article on the placing surface while interference between the first positioning member and the second article is avoided.

The first positioning member is used to position the first article without contact with the second article. The second positioning member is used to position the second article without contact with the first article. Therefore, one support device is usable in common to support the first article and the second article. Both the first article and the second article are containers for accommodating semiconductor wafers for example, and the second article is configured to accommodate semiconductor wafers having a larger diameter compared with those accommodated in the first article.

It is preferable that the first positioning member comprises at least a pair of pins protruding from the placing surface, and configured to be engaged with holes in the bottom portion of said first article, to enter recessed portions in the bottom portion of said second article, and not to come into contact with the second article. This makes the first article easily positioned and placed without disturbing the positioning of the second article.

It is preferable that said second positioning member comprises at least a pair of guiding members protruding from the placing surface, and is configured to guide an outer perimeter of the bottom portion of said second article. Since the bottom portion of the second article is larger than that of the first article, when the second positioning member is provided so as to guide the outer perimeter of the bottom portion of the second article, interference with the first article is prevented. The second article is reliably positioned with the guide by at least a pair of guiding members. Each of the pair of guiding members includes for example, a pair of tapered surfaces different in inclination direction, and the pairs of tapered surfaces are configured to guide corners of the outer perimeter of the bottom portion of the second article.

It is particularly preferable that the first positioning member comprises at least a pair of pins protruding from the placing surface configured to be engaged with holes in the bottom portion of said first article, to enter three positioning grooves, for example, that are provided radially in the bottom portion of said second article, and not to come into contact with said second article. When said second article is provided with positioning grooves, the pins may be provided at positions at which the pins enter the grooves and are engaged with the holes of the bottom portion of said first article. Therefore, said first article is reliably positioned, while interference with the second article is prevented. It is particularly preferable that three positioning grooves, for example, are radially provided in the bottom portion of the first article, and the article support device is configured to position the bottom portion of said first article and the bottom portion of said second article without coming into contact with the positioning grooves of said first article nor the positioning grooves of said second article.

DETAILED DESCRIPTION OF THE PREFERRED EMBODIMENT

The following describes an optimum embodiment for carrying out the present invention. The scope of the present invention is based on the recitation of the claims, and is intended to be determined in accordance with the understanding of a person skilled in the art with reference to the recitation of this description and well-known techniques in the field of the present invention.

Embodiment

Figure 1:
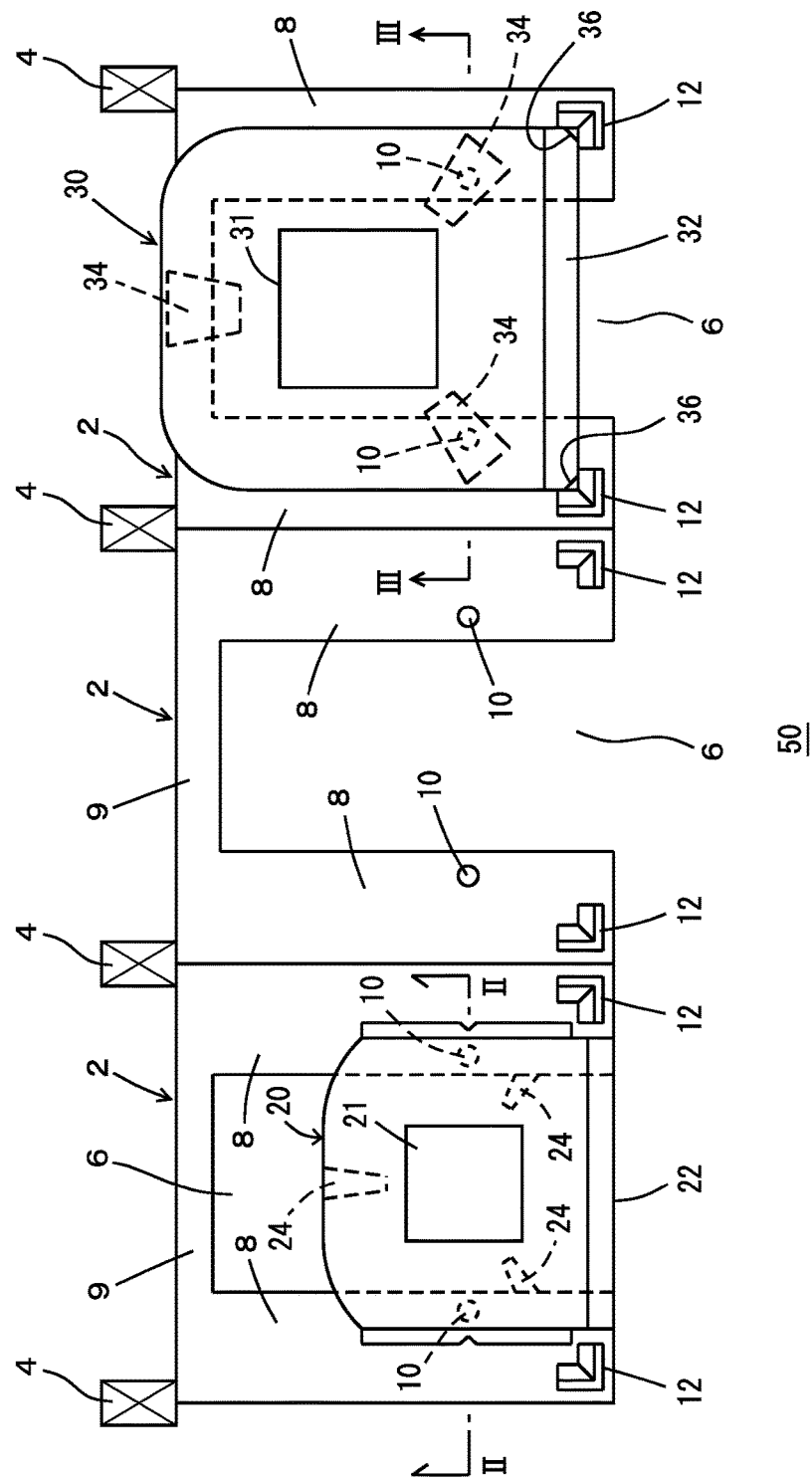
FIG. 1 is a plan view showing an arrangement of support devices according to an embodiment.

FIGS. 1 to 5 show support devices 2 according to an embodiment and a stocker 50 in which the support devices 2 are used. FIG. 1 shows the support devices 2 arranged in the stocker. The support devices 2 are attached to vertical supports 4 of the stocker 50 and are vertically and laterally arranged. Each support device 2 has a plate-like shape and has an opening 6 on a side opposite to the vertical supports 4, a placing surface 8 on the opposite two sides of the opening 6, and a placing surface 9 on the vertical support 4 side. The placing surface 8 is provided with a pin 10 and a tapered piece 12, and thus the support device 2 includes a pair of pins 10 and a pair of tapered pieces 12. In this description, the vertical support 4 side is referred to as a back side, a front end side of the opening 6 is referred to as a front side, and the pin 10 is located on the back side with respect to the tapered piece 12 and near the opening 6. Three or more pins 10 and three or more tapered pieces 12 may be provided. In particular, the tapered pieces 12 are further provided at two positions on the back side of the support device 2 in addition to the two positions on the front side thereof, and corners of an article 30 are positioned by the tapered pieces 12 at the four positions, thus obtaining improved accurate positioning of the article 30. However, as in the embodiment, the tapered pieces 12 may be provided at only two positions on the front side of the support device 2.

20 indicates a first article, and 30 indicates a second article. The first article 20 (referred to as merely "article 20" hereinafter) is a container for accommodating a 300 mm semiconductor wafer, for example, and the second article 30 (referred to as merely "article 30" hereinafter) is a container for accommodating a 450 mm semiconductor wafer, for example. The articles 20 and 30 may be any type of articles as long as a bottom portion of the article 30 is larger than that of the article 20. The article 20 is positioned by the pins 10 without interfering with the tapered pieces 12, and the article 20 is positioned by the tapered pieces 12 without interfering with the pins 10. 21 and 31 indicate top portions of the articles 20 and 30, respectively, and the top portions 21 and 31 are used by an overhead travelling vehicle or the like to hold the articles 20 and 30. 22 and 32 indicate doors through which wafers are brought to or removed from the articles 20 and 30.

The articles 20 and 30 are provided with positioning grooves 24 and 34, respectively. In the original standard, the articles 20 and 30 are positioned by kinematic coupling between pins (not shown) of the support device and the grooves 24 and 34, and cross sections of the grooves 24 and 34 have a "V" shape in a direction orthogonal to a longitudinal direction of the grooves. However, if the articles 20 and 30 are positioned by the grooves 24 and 34, only one of the articles 20 and 30 is placed on the support device 2. Therefore, the article 20 is positioned with the pins 10 on the placing surfaces 8 being engaged with holes provided in the bottom portion of the article 20. Moreover, as for the article 30, corners 36 of the article 30 are positioned by the tapered pieces 12 on the placing surfaces 8.

Figure 2:
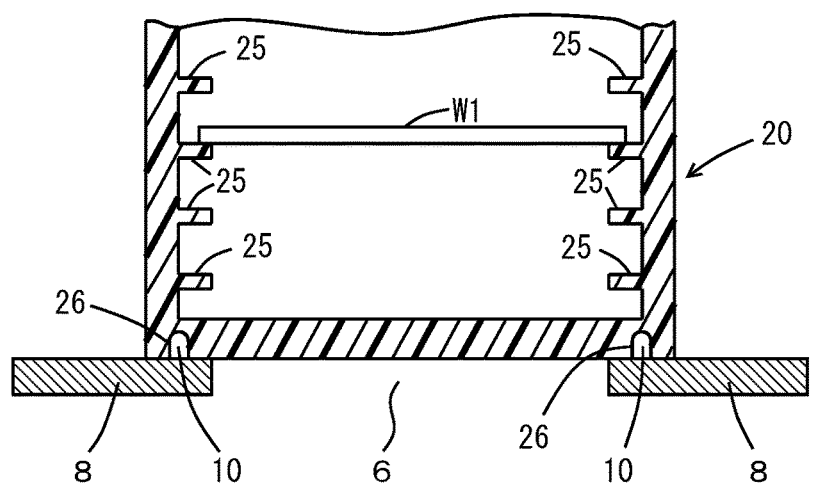
FIG. 2 is a cross-sectional view of a main portion of the support device taken along line II-II in FIG. 1 where a first article is placed on the support device.
Figure 3:
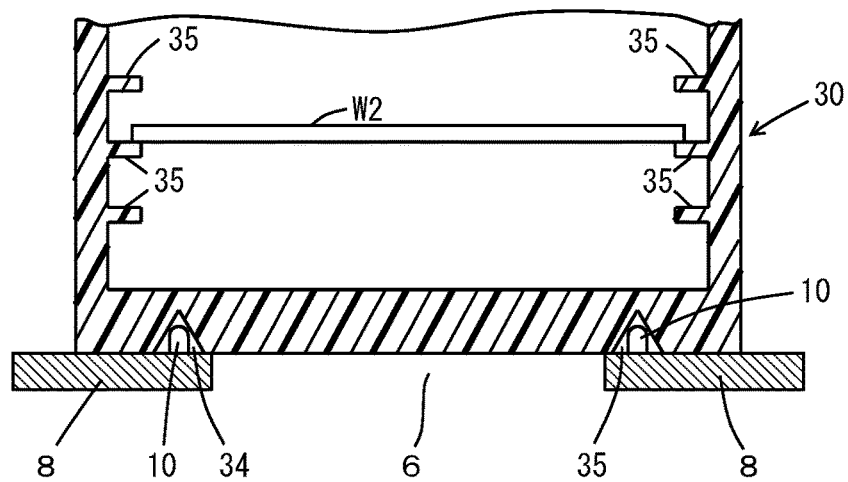
FIG. 3 is a cross-sectional view of a main portion of the support device taken along line III-III in FIG. 1 where a second article is placed on the support device.

FIG. 2 shows positioning of the article 20. The article 20, which is a container for a 300 mm wafer, is generally provided with a pair of holes 26 for being engaged with pins that are called forklift pins. The pins 10 are provided so as to be engaged with the holes 26. Positions at which the pins 10 are provided and positions at which the article 30 is placed on the support device 2 are selected so that the pins 10 are located in the positioning grooves 34 of the article 30 and do not interfere with the article 30. FIG. 3 shows this state. 25 and 35 indicate shelves in the articles 20 and 30, respectively, and W1 and W2 indicate the semiconductor wafers placed on the shelves 25 and 30.

Figure 4:
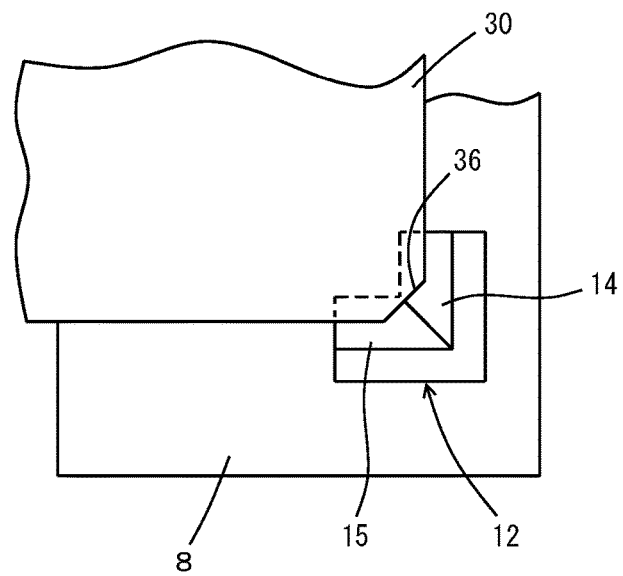
FIG. 4 is a partial plan view showing positioning of the second article.
Figure 5:
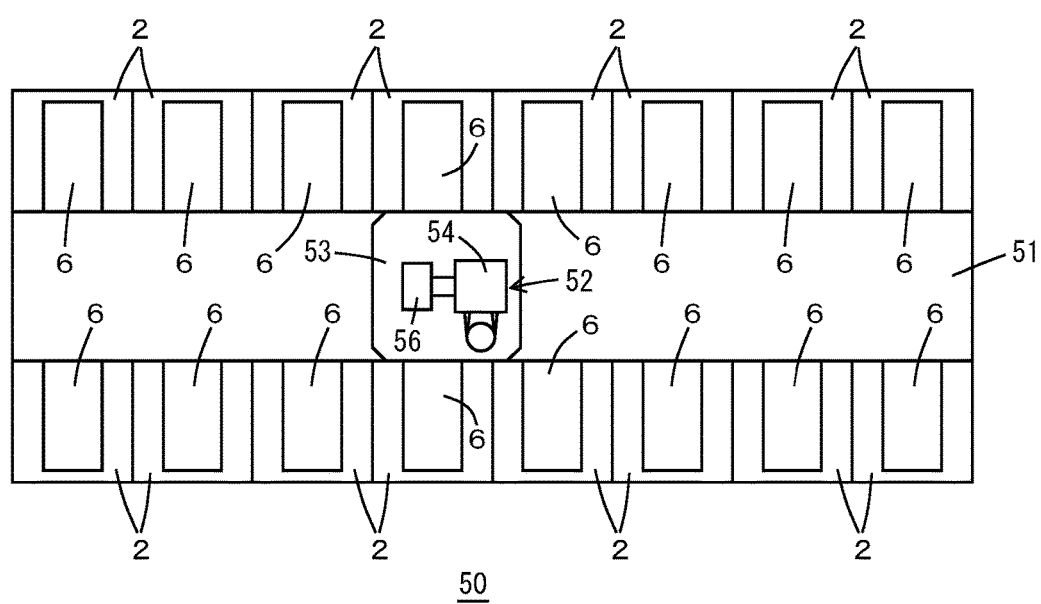
FIG. 5 is a plan view of a stocker where the support devices according to the embodiment are used.

Since the positioning grooves 34 of the article 30 are used to avoid interference with the pins 10, a pair of corners 36 on the door 32 side of the article 30 is positioned by the tapered pieces 12. FIG. 4 shows this state. The tapered pieces 12 each include a tapered surface 14 that is inclined in a lateral direction and a tapered surface 15 that lowers from the front side to the back side. The article 30 is positioned by guiding the pair of corners 36 by a pair of left and right tapered pieces 12. In addition to the corners 36, any recessed and projecting portions on the outer perimeter of the bottom portion of the article 30 can be used for positioning.

The support device 2 is usable in any application for placing the articles 20 and 30. When the support device 2 is used as a support member in the stocker 50, for example, the stocker 50 is usable in common for 300 mm wafers and 450 mm wafers. A transport device 52 moves in a central transport space 51, and loads and unloads the article in and from the support devices 2. The support devices 2 are arranged on two sides of the transport space 51 over a plurality of layers. Although the transport device 52 may be any type of transport device, for example, a mast 56 is provided on a vehicle 53, and a driver for a transfer hand 54 is moved up and down. The hand 54 may be used in common for the articles 20 and 30 or dedicated hands to the respective articles 20 and 30 may be provided. Furthermore, different transport devices may be provided for the respective articles 20 and 30.

LIST OF REFERENCE NUMERALS

2 Support device
4 Vertical support

6 Opening
8, 9 Placing surface
10 Pin
12 Tapered piece
14, 15 Tapered surface
20 First article
30 Second article
21, 31 Top portion
22, 32 Door
24, 34 Positioning groove
25, 35 Shelf
26 Hole
36 Corner
50 Stocker
51 Transport space
52 Transport device
53 Vehicle
54 Hand
56 Mast
W1, W2 Semiconductor wafer

What is claimed is:

1. An article support device supporting a plurality of types of articles thereon comprising:
a placing surface configured to support both a first article and a second article having a larger bottom portion than a bottom portion of said first article thereon;
a first positioning member comprising at least a pair of pins protruding from said placing surface, and configured to be engaged with holes in the bottom portion of said first article, to enter positioning grooves provided radially in the bottom portion of said second article, when said second article is positioned on the placing surface, and not to interfere with said second article; and
a second positioning member protruding from said placing surface for positioning said second article,
wherein said second positioning member is arranged at a position where interference with said first article is prevented, when said first article is positioned on the placing surface by said first positioning member,
wherein said second positioning member comprises at least a pair of guiding members protruding from the placing surface, and configured to guide an outer perimeter of the bottom portion of said second article, and
wherein each of the pair of guiding members includes a pair of tapered surfaces different in inclination direction, and the pairs of tapered surfaces are configured to guide corners of the outer perimeter of the bottom portion of said second article.

2. The article support device according to claim 1,
wherein both said first article and said second article are containers for accommodating semiconductor wafers, and said second article is configured to accommodate semiconductor wafers having a larger diameter compared with those accommodated in said first article.

3. The article support device according to claim 2, wherein
said first article is provided with positioning grooves radially in the bottom portion thereof, and
the article support device is configured to position the bottom portion of said first article and the bottom portion of said second article without coming into contact with the positioning grooves of said first article nor the positioning grooves of said second article.

4. A method for placing two types of articles on a support device,
the support device comprising: a placing surface configured to support both a first article and a second article having a larger bottom portion than a bottom portion of said first article thereon; a first positioning member; and a second positioning member, both protruding from said placing surface,
said first positioning member comprising at least a pair of pins protruding from said placing surface, and configured to be engaged with holes in the bottom portion of said first article, to enter positioning grooves provided radially in the bottom portion of said second article when said second article is positioned on the placing surface, and not to interfere with said second article,
the method comprising:
a step for positioning the first article by the first positioning member and placing the first article on the placing surface while interference between the second positioning member and the first article is avoided, and
a step for positioning the second article by the second positioning member and placing the second article on the placing surface while interference between the first positioning member and the second article is avoided,
wherein said second positioning member comprises at least a pair of guiding members protruding from the placing surface, and the guiding members guide an outer perimeter of the bottom portion of said second article, and
wherein each of the pair of guiding members includes a pair of tapered surfaces different in inclination direction, and the pairs of tapered surfaces guide corners of the outer perimeter of the bottom portion of said second article.

5. The method for placing two types of articles on a support device according to claim 4,
wherein said second positioning member comprises at least a pair of guiding members protruding from the placing surface, and configured to guide an outer perimeter of the bottom portion of said second article.

* * * * *